United States Patent [19]

Mears

[11] 4,450,416
[45] May 22, 1984

[54] VOLTAGE CONTROLLED OSCILLATOR

[75] Inventor: Gregory N. Mears, Forest, Va.

[73] Assignee: General Electric Company, Lynchburg, Va.

[21] Appl. No.: 293,395

[22] Filed: Aug. 17, 1981

[51] Int. Cl.³ .............................................. H03B 5/00
[52] U.S. Cl. ......................... 331/117 FE; 331/117 R; 331/177 V
[58] Field of Search ........ 331/117 R, 117 FE, 177 V; 334/14

[56] References Cited

U.S. PATENT DOCUMENTS

| | | | |
|---|---|---|---|
| 3,416,096 | 12/1968 | Kim | 331/117 FE |
| 3,624,541 | 11/1971 | Lundstrom | 331/117 FE |
| 3,745,480 | 7/1973 | Putzer | 331/177 V |

Primary Examiner—Stanley D. Miller
Assistant Examiner—B. P. Davis
Attorney, Agent, or Firm—James J. Williams

[57] ABSTRACT

A voltage controlled oscillator is provided with one or more varactors connected in series with the frequency determining capacitors of the oscillator. These varactors are in addition to prior art varactors, and increase the tunable range of the oscillator, and improve the frequency variation with control voltage characteristic of the oscillator.

7 Claims, 2 Drawing Figures

VOLTAGE CONTROLLED OSCILLATOR

BACKGROUND OF THE INVENTION

My invention relates to a voltage controlled oscillator, and particularly to a circuit for improving the frequency-change-versus-control-voltage characteristics of the voltage controlled oscillator.

Voltage controlled oscillators are used in many applications, one example being a frequency synthesizer. In some of those applications, the frequency change of the voltage controlled oscillator as a function of control voltage should be made as large as possible, while at the same time the rate of change in output frequency of the oscillator as a function of control voltage should be kept as consistent as possible. In the past, as far as I am aware, the only effort that has been made to meet these needs has been to find a voltage variable capacitor whose characteristics meet these needs. Obviously, that effort is limited by the available or known solid state techniques, so that some sort of improved circuit is needed.

SUMMARY OF THE INVENTION

My invention provides an improved voltage controlled oscillator whose rate of change in frequency as a function of conrol voltage is more consistent over the radio frequency band, and is larger than prior art voltage controlled oscillators. Known prior art voltage controlled oscillators comprised an oscillator with a frequency determining circuit connected between control voltage terminals and the oscillator. Typically, the frequency determining circuit used a capacitor and a voltage variable reactor (usually a varactor whose capacity varied with applied voltage). In accordance with my invention, I provide one or more additional voltage variable reactors connected in series with the capacitor of the frequency determining circuit of the oscillator. The effect of the additonal voltage variable reactor in series with the frequency determining capacitor is to increase the frequency change per volt of control voltage change. The voltage variable reactor also provides added control so that the rate of change of frequency with control voltage change is more constant over the radio frequency band, even though this total frequency change is increased.

BRIEF DESCRIPTION OF THE DRAWING

The subject matter which I regard as my invention is particularly pointed out and distinctly claimed in the claims. The structure and operation of my invention, as well as advantages, may be better understood from the following description given in connection with the accompanying drawing, in which:

DESCRIPTION OF THE PREFERRED EMBODIMENT

Figure 1:
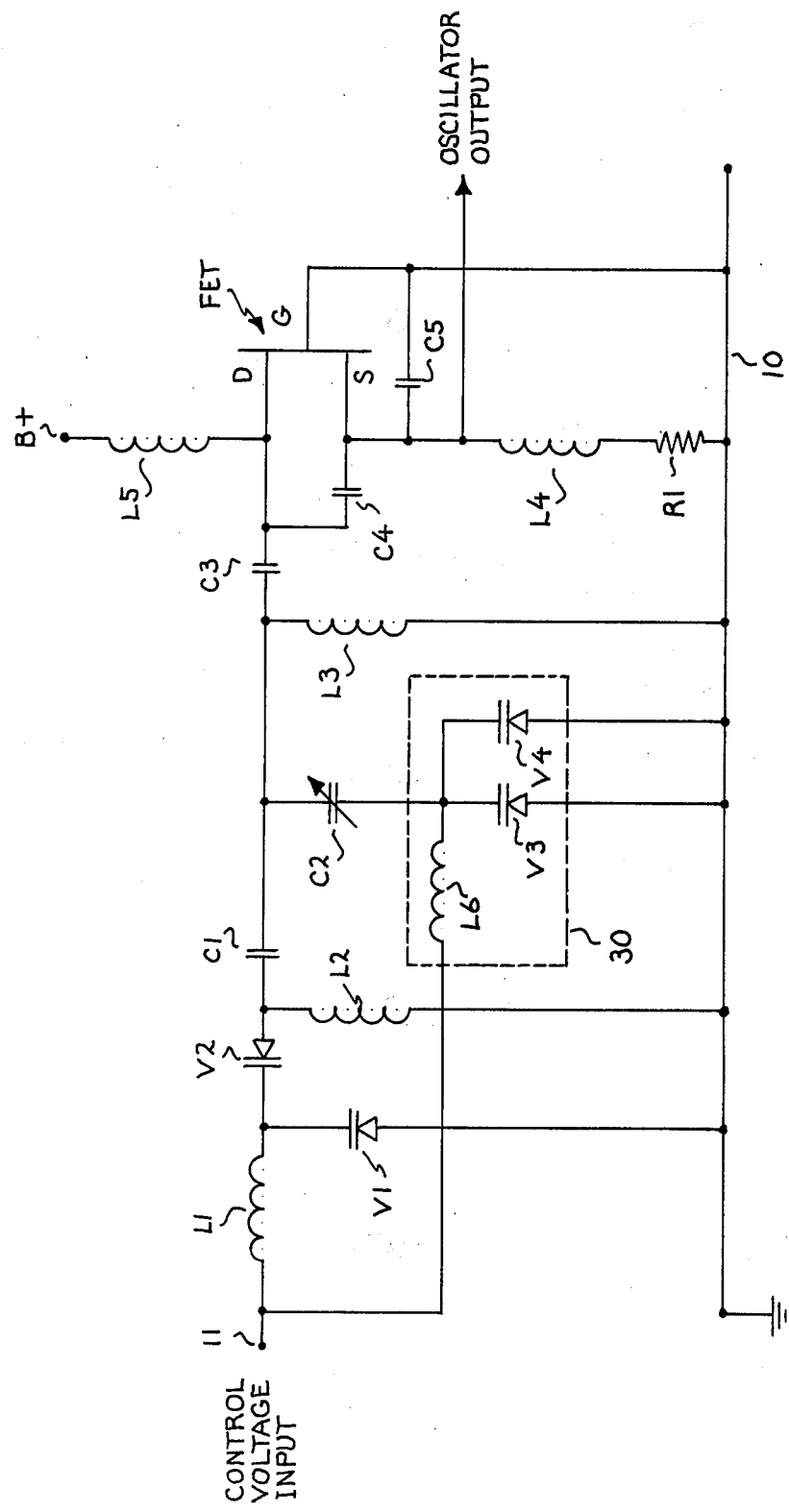
FIG. 1 shows a schematic diagram of one preferred embodiment of a voltage controlled oscillator in accordance with my invention.

FIG. 1 shows a schematic diagram of a voltage controlled oscillator in accordance with my invention. While I contemplate that my oscillator is used in a frequency synthesizer, persons skilled in the art will appreciate that such an oscillator can be used in many other applications. The oscillator that I have selected includes an active device, preferably a field effect transistor FET having a drain electrode D, a gate electrode G, and a source electrode S. These electrodes are provided with a suitable source of direct current voltage whose positive terminal B+ is connected by an inductor L5 to the drain electrode D. The negative terminal of the voltage source is connected to a common terminal or ground 10. The electrodes D, G, and S are regeneratively connected as a Colpitts oscillator by capacitors C4, C5. Persons skilled in the art will appreciate that my invention can be used with other types of oscillators. Source electrode S may provide the oscillator output, and is also connected to the common terminal 10 through a direct current path comprising a series inductor L4 and a resistor R1. The oscillator is provided with a frequency determining circuit including a capacitor C3, a tunable or variable capacitor C2, and an inductor L3. In accordance with prior art circuits, voltage variable reactors, such as varactors or varactor diodes V1, V2, are connected to the frequency determining circuit. As known in the art, these varactors V1, V2 present a capacity which varies in accordance with the direct current voltage across them. This voltage is applied to a control voltage input terminal 11 and the common terminal 10. This voltage is applied through an inductor L1 to both of the varactors V1, V2, with the varactor V1 having a direct connection to the terminal 10 and the varactor V2 having a return path through an inductor L2 to the terminal 10. The direct current control voltage is isolated from the frequency determining circuit of the oscillator by a series capacitor C1.

In prior art control circuits of which I am aware, the variable capacitor C2 was connected at its upper end (as viewed in FIG. 1) to the oscillator, and connected at its lower end (as viewed in FIG. 1) directly to the common terminal 10. A resonating inductor L3 was connected or coupled in parallel with this variable capacitor C2. Such a circuit had a limited change in frequency as a function of control voltage. In addition, this change or variation was not consistent. That is, for a given change in control voltage, the change in oscillator frequency between the maximum and minimum values of the capacitor C2 was relatively large, as illustrated by the dashed line curves 21, 22 of FIG. 2. These curves 21, 22 are separated by approximately 1.1 minus 0.6 or 0.5 MHz. Thus, when the capacitor C2 is varied from its maximum position to its minimum position, the change of oscillator frequency per control volt is 0.5/0.6 or approximately 83%. This is relatively inconsistent and undesirable for many applications.

Figure 2:
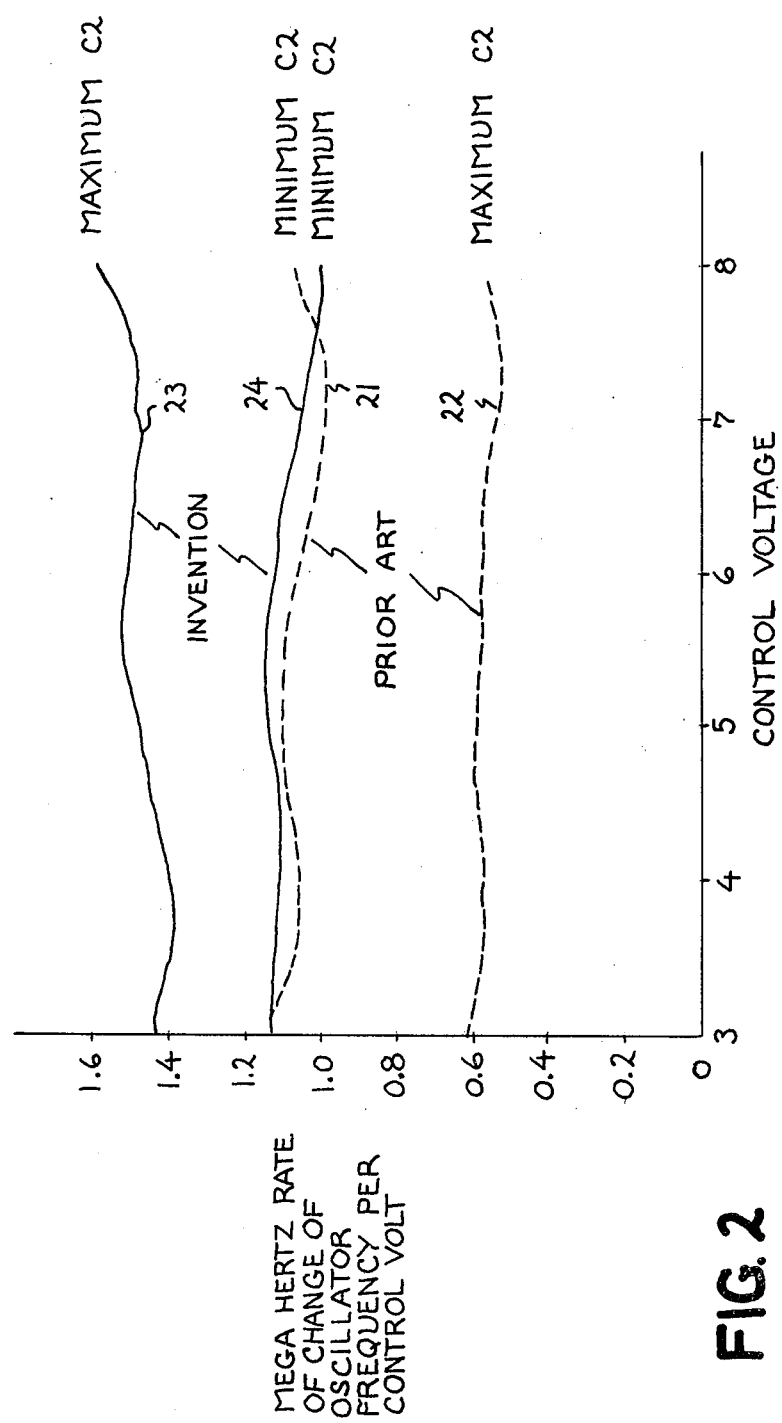
FIG. 2 shows curves illustrating the advantages of my invention over the prior art.

In accordance with my invention, I provide an improved circuit for making the frequency change more consistent over the radio frequency band, and also for increasing the frequency change with control voltage characteristics. My circuit is enclosed in the dashed line rectangle 30 of FIG. 1. This circuit is comprised of one or more varactors V3, V4 having one end connected to the other or lower end of the variable capacitor C2, and connected to the control terminal 11 through an inductor L6, and havng the other end connected to the common terminal 10. Thus, these one or more varactors V3, V4 are connected in series with the tuning capacitor C2. The effect of these varactors V3, V4 is shown by the solid line curves 23, 24 in FIG. 2. In FIG. 2, it will be noted that the maximum and minimum capacity curves 23, 24 provide a greater rate of change of frequency as a function of control voltage. Further, the curves 23, 24 are relatively close together, and hence provide a more consistent change of oscillator output frequency as a function of control voltage than do the dashed line prior art curves 21, 22 for the same set of conditions. These curves 23, 24 are separated by approximately 1.5 minus 1.1 or 0.4 MHz. Thus, when capacitor C2 is varied from its maximum position to its minimum position, the change of oscillator frequency per control volt is 0.4/1.5 or approximately 27%. This is more consistent than the 83% change mentioned above for the prior art. In FIG. 2, it will also be noted that the invention causes an increase in frequency change as the capacitor C2 is tuned from minimum to maximum. This is because the percentage of total capacity across the tuned circuit that is variable with changing control voltage has been increased over the previous design.

It will thus be seen that I have provided a new and improved circuit for improving the characteristics of a voltage controlled oscillator. While I have shown only one embodiment, persons skilled in the art will appreciate that modifications can be made. For example, various types of oscillators can be used, and these oscillators can be utilized in almost any application. Furthermore, only one varactor can be used in my circuit 30, although I show two varactors for providing a relatively wide range. The selection of the number of such varactors will depend in part on their characteristics. Therefore, while I have described my invention with reference to only one embodiment, it is to be understood that modifications may be made without departing from the spirit of the invention or from the scope of the claims.

What I claim as new and desire to secure by Letters Patent of the United States is:

1. An improved voltage controlled oscillator comprising:
   a. a source of voltage;
   b. an active device having electrodes coupled to said source of voltage;
   c. a circuit regeneratively coupled to the electrodes of said active device to cause said active device to produce electrical oscillations;
   d. a frequency determining circuit comprising at least one capacitor coupled to said active device;
   e. a control terminal;
   f. a first varactor coupled between said control terminal and said frequency determining circuit;
   g. at least one varactor coupled in series with said one capacitor of said frequency determining circuit;
   h. and means coupling said conrol terminal to said at least one varactor.

2. The improved frequency control circuit of claim 1 wherein said frequency determining circuit further comprises an inductor coupled in parallel with said frequency determining circuit.

3. The improved frequency control circuit of claim 1 and further comprising an additional varactor coupled in parallel with said at least one varactor.

4. The improved frequency control circuit of claim 2 and further comprising an additional varactor coupled in parallel with said at least one varactor.

5. An improved voltage controlled oscillator circuit comprising:
   a. a voltage source terminal;
   b. a common terminal;
   c. an active device having current electrodes coupled between said terminals and having a control electrode;
   d. A circuit regeneratively coupled to the electrodes of said active device to cause said active device to produce electrical oscillations;
   e. a frequency determining circuit comprising a capacitor and an inductor coupled in a parallel circuit between one of said electrodes and one of said terminals;
   f. a control terminal;
   g. a first varactor coupled between said control terminal and said one electrode;
   h. a second varactor coupled between said control terminal and said one terminal;
   i. a third varactor coupled in series between said capacitor and said one terminal;
   j. and means coupling said control terminal to said third varactor.

6. The improved oscillator of claim 5 wherein said regeneratively coupled circuit comprises capacitors.

7. The improved oscillator of claim 5 and further comprising a fourth varactor coupled in parallel with said third varactor.

* * * * *